(12) United States Patent
Jung et al.

(10) Patent No.: US 11,445,637 B2
(45) Date of Patent: Sep. 13, 2022

(54) ELECTRONIC DEVICE COMPRISING HEAT RADIATING STRUCTURE

(71) Applicant: SAMSUNG ELECTRONICS CO., LTD., Suwon-si (KR)

(72) Inventors: Chung-Hyo Jung, Suwon-si (KR); Kang-Sik Kim, Suwon-si (KR); Young-San Kim, Suwon-si (KR); Won-Min Kim, Yongin-si (KR); Chi-Hyun Cho, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 16/763,074

(22) PCT Filed: Aug. 28, 2018

(86) PCT No.: PCT/KR2018/009900
§ 371 (c)(1),
(2) Date: May 11, 2020

(87) PCT Pub. No.: WO2019/093635
PCT Pub. Date: May 16, 2019

(65) Prior Publication Data
US 2020/0352057 A1    Nov. 5, 2020

(30) Foreign Application Priority Data

Nov. 10, 2017 (KR) .................. 10-2017-0149637

(51) Int. Cl.
*H05K 7/20* (2006.01)
*H01L 23/552* (2006.01)
*H05K 9/00* (2006.01)

(52) U.S. Cl.
CPC ....... *H05K 7/20436* (2013.01); *H01L 23/552* (2013.01); *H05K 9/00* (2013.01)

(58) Field of Classification Search
CPC .......... H05K 7/20436; H05K 7/20445; H05K 7/20472; H05K 1/0201; H05K 1/0203;
(Continued)

(56) References Cited

U.S. PATENT DOCUMENTS

| 6,084,178 A * | 7/2000 | Cromwell ............ H05K 9/0032 |
| | | 174/16.3 |
| 10,674,596 B2 * | 6/2020 | Matsumoto ............ H05K 1/181 |
| 2006/0133049 A1 * | 6/2006 | Hagiwara ........... H01L 23/4338 |
| | | 361/720 |

(Continued)

FOREIGN PATENT DOCUMENTS

| CN | 106659061 | 5/2017 |
| CN | 106686962 | 5/2017 |

(Continued)

OTHER PUBLICATIONS

Extended Search Report dated Feb. 5, 2021 in counterpart European Patent Application No. 18877031.7.

(Continued)

*Primary Examiner* — Hoa C Nguyen
*Assistant Examiner* — Amol H Patel
(74) *Attorney, Agent, or Firm* — Nixon & Vanderhye, P.C.

(57) ABSTRACT

According to various embodiments of the present invention, an electronic device can comprise: a circuit board; an electronic component arranged on one surface of the circuit board; a thermal conductive member arranged so as to correspond to the upper surface of the electronic component; and a thermal interface member arranged between the electronic component and the thermal conductive member and comprising a carbon fiber. The electronic device can be variously implemented according to embodiments.

5 Claims, 5 Drawing Sheets

(58) Field of Classification Search
CPC .. H05K 1/0204; H05K 9/0032; H05K 9/0024; H05K 9/0022; H05K 9/002; H01L 23/552
See application file for complete search history.

(56) References Cited

U.S. PATENT DOCUMENTS

| | | | | |
|---|---|---|---|---|
| 2007/0210082 | A1* | 9/2007 | English | H05K 9/0032 220/4.21 |
| 2008/0291358 | A1* | 11/2008 | Lee | G02F 1/133608 349/58 |
| 2014/0313680 | A1* | 10/2014 | Kil | H05K 9/0032 361/752 |
| 2015/0042528 | A1* | 2/2015 | Jung | H01Q 1/523 343/841 |
| 2015/0241936 | A1* | 8/2015 | Hur | H05K 1/0203 165/135 |
| 2016/0301442 | A1* | 10/2016 | Sohn | H04M 1/19 |
| 2017/0238410 | A1* | 8/2017 | Li | H05K 9/0009 361/709 |
| 2020/0053869 | A1* | 2/2020 | Wang | H05K 1/0218 |

FOREIGN PATENT DOCUMENTS

| | | |
|---|---|---|
| JP | 2001-335602 | 12/2001 |
| JP | 2006-179712 | 7/2006 |
| KR | 10-2008-0102676 | 11/2008 |
| KR | 10-2013-0088614 | 8/2013 |
| KR | 10-2016-0004786 | 1/2016 |
| KR | 10-2017-0097541 | 8/2017 |
| KR | 10-2018-0094831 | 8/2018 |
| WO | 2017/0065922 | 4/2017 |

OTHER PUBLICATIONS

Communication pursuant to Rule 164(1) EPC dated Oct. 5, 2020 in counterpart European Patent Application No. 18877031.7.
International Search Report for PCT/KR2018/009900 dated Nov. 28, 2018, 4 pages.
Written Opinion of the ISA for PCT/KR2018/009900 dated Nov. 28, 2018, 5 pages.

* cited by examiner

ELECTRONIC DEVICE COMPRISING HEAT RADIATING STRUCTURE

CROSS-REFERENCE TO RELATED APPLICATIONS

This application is a U.S. National Stage application under 35 U.S.C. § 371 of an International application filed on Aug. 28, 2018 and assigned application number PCT/KR2018/009900, which claimed the priority of a Korean patent application filed on Nov. 10, 2017 in the Korean Intellectual Property Office and assigned Serial number 10-2017-0149637, the entire disclosure of which is hereby incorporated by reference.

TECHNICAL FIELD

Various embodiments of the disclosure relate to an electronic device. For example, various embodiments of the disclosure relate to an electronic device including a heat radiation structure for dissipating and releasing heat generated from an electric component.

BACKGROUND ART

Typically, an electronic device means a device that performs a specific function according to a program incorporated therein, such as an electronic scheduler, a portable multimedia reproducer, a mobile communication terminal, a tablet PC, an image/sound device, a desktop/laptop PC, or a vehicle navigation system, including a home appliance. The above-mentioned electronic devices may output, for example, information stored therein as sound or an image. As the integration degree of such electronic devices has increased and super-high speed and large-capacity wireless communication has become popular, various functions have recently been provided in a single mobile communication terminal. For example, various functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function. As the performance of electric components equipped with processors, communication modules, and the like, for example, integrated circuit chips, has been dramatically improved, there is provided an environment in which these various functions are incorporated in an electronic device.

DETAILED DESCRIPTION OF THE INVENTION

Technical Problem

Improving the performance of electric components not only provides an environment in which various functions are capable of being provided in a single electronic device, but also improves data communication or processing speed. In order to create a stable operating environment for an electric component, it is possible to suppress electromagnetic interference on other electric components around the electric component and to quickly release heat generated in an operation such as signal processing. For example, an electric component may require an environment in which the electric component is disposed in an electromagnetically shielded state with respect to the surrounding environment and is capable of smoothly releasing heat generated during operation.

However, since electromagnetic shielding performance and heat radiation performance are mutually exclusive, it may be difficult to simultaneously obtain a good electromagnetic shielding environment and a smooth heat release environment. For example, in order to smoothly release the generated heat, an electric component may be exposed to the external space or the space in which the electric component is disposed may be opened to the external space. However, it may be difficult to ensure the electromagnetic shielding performance through such an open structure. The stable shielding structure may be generally realized by sealing the region or space in which the electric component is disposed with a shielding member such as a shield can. However, in this sealing structure, heat generated during the operation of the electric component may not be smoothly released to the outside of the shielding member.

Thus, various embodiments of the disclosure are capable of providing an electronic device having a heat radiation structure capable of providing a stable operation environment for an electric component.

Various embodiments of the disclosure are capable of providing an electronic device including a stable electromagnetic shielding structure while being miniaturized and smoothly releasing heat generated by the operation of the electric component.

Technical Solution

According to various embodiments of the disclosure, an electronic device may include:

a circuit board; an electric component disposed on one face of the circuit board; a heat conductive member (e.g., thermal conductive member) disposed corresponding to an upper face of the electric component; and a heat transfer member (e.g., thermal interface member) disposed between the electric component and the heat conductive member and including carbon fiber.

According to various embodiments of the disclosure, an electronic device may include:

a circuit board; an electric component disposed on one face of the circuit board; an electromagnetic shielding member mounted so as to cover at least a portion of the electric component on one face of the circuit board; an opening formed in the shielding member so as to expose a portion of the electric component to the outside of the shielding member; and a heat transfer member attached to an outer face of the shielding member to close the opening and connected to the portion of the electric component through the opening.

The heat transfer member may form an electromagnetic shielding structure together with the shielding member.

Advantageous Effects

According to various embodiments of the disclosure, the heat transfer member may form a stable operating environment for an electric component by transferring and dissipating heat generated from the electric component to another space or structure. According to an embodiment, the heat transfer member is capable of providing an electromagnetic shielding structure with respect to the external environment by including a material capable of providing an electromagnetic shielding function, such as magnetic particles or ferrite particles. For example, in an electronic device according to various embodiments of the disclosure, the heat transfer member is capable of providing a stable operating environment for an electric component by blocking an external electromagnetic field or the like while smoothly releasing heat generated by the operation of the electric component. The heat transfer member according to various embodiments of the disclosure is capable of providing a stable heat radiation structure and an electromagnetic shielding structure by itself so as to be easily mounted even in a miniaturized electronic device.

MODE FOR CARRYING OUT THE INVENTION

Figure 1:
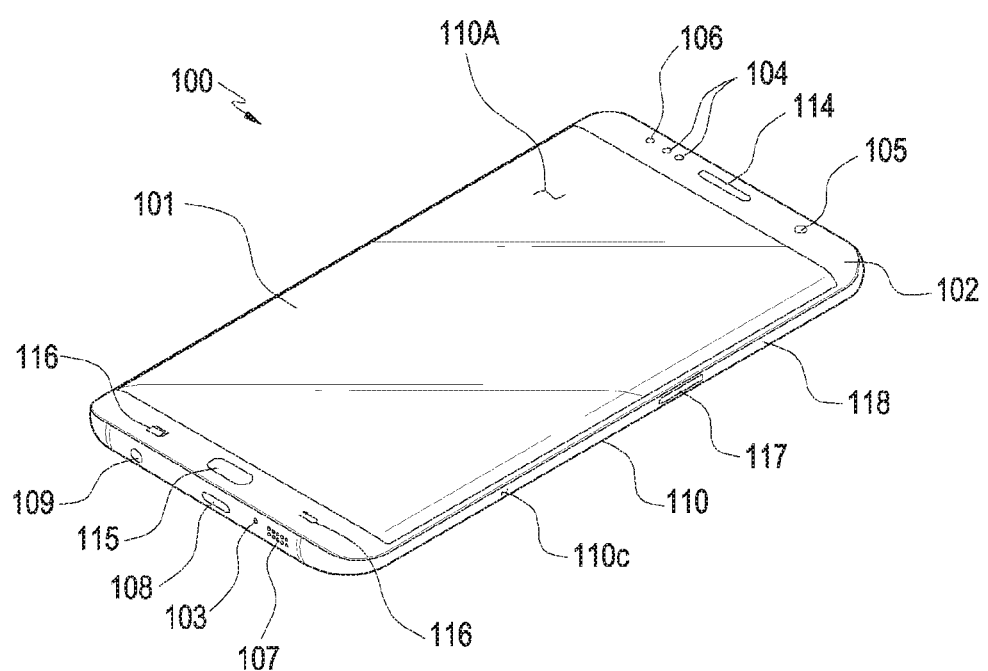
FIG. 1 is a perspective view illustrating an electronic device according to various embodiments of the disclosure.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the disclosure.

Ordinal terms such as "first" or "second" may be used to describe, not limiting, various components. These expressions are used to distinguish one component from another component. For example, a first component may be referred to as a second component, and vice versa without departing from the scope of the disclosure. The term 'and/or' includes one or a combination of two or more of a plurality of enumerated items.

Relative terms described with respect to what is seen in the drawings, such as "front surface," "rear surface," "top surface," and "bottom surface" may substitute for ordinal numbers such as "first" and "second." The sequence of ordinal numbers such as "first" and "second" is determined in a mentioned order or an arbitrary order, and may be changed arbitrarily when needed.

The terms as used in the disclosure are provided to merely describe specific embodiments, not intended to limit the scope of the disclosure. It is to be understood that singular forms include plural referents unless the context clearly dictates otherwise. In the disclosure, the term "include" or "have" signifies the presence of a feature, number, operation, component, part, or a combination thereof described in the disclosure, not excluding the presence of one or more other features, numbers, operations, components, parts, or a combination thereof.

Unless otherwise defined, the terms and words including technical or scientific terms used herein may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

In the disclosure, the electronic device may be an arbitrary device including a touch panel, and the electronic device may be referred to as a terminal, a portable terminal, a mobile terminal, a communication terminal, a portable communication terminal, a portable mobile terminal, and a display device.

For example, the electronic device may be a smartphone, a portable phone, a navigation device, a gaming device, a TV, a head unit for a vehicle, a notebook computer, a laptop computer, a tablet computer, a personal media player (PMP), and a person digital assistant (PDA). The electronic device may be implemented as a portable communication terminal of a pocket size, which has a wireless communication function. Further, the electronic device may be a flexible device or a flexible display device.

The electronic device may communicate with an external electronic device, such as a server, and may perform an operation in conjunction with an external electronic device. For example, the electronic device may transmit an image captured by a camera or location information detected by a sensor unit, to a server through a network. The network is not limited thereto, but may be a mobile or cellular communication network, a local area network (LAN), a wireless local area network (WLAN), a wide area network (WAN), the internet, and a small area network (SAN).

Figure 2:
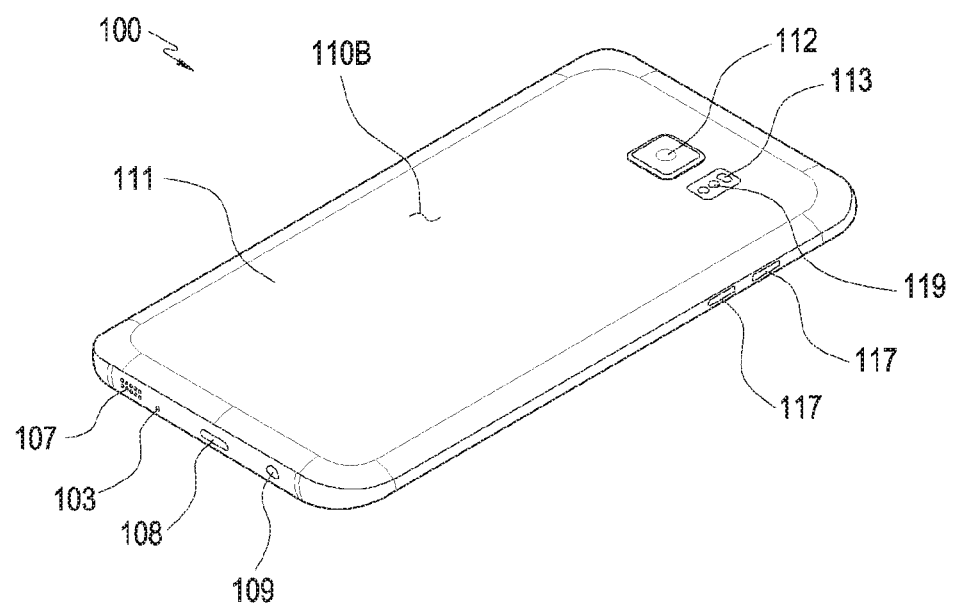
FIG. 2 is a perspective view illustrating the rear side of the electronic device of FIG. 1.

FIG. 1 is a perspective illustrating an electronic device 100 according to various embodiments of the disclosure. FIG. 2 is a perspective view illustrating the rear side of the electronic device 100 of FIG. 1.

Referring to FIGS. 1 and 2, an electronic device 100 according to an embodiment may include a housing 110 including a first face (or a front face) 110A, a second face (or a rear face) 110B, and a side face 110C surrounding the space between the first face 110A and the second face 110B. In another embodiment (not illustrated), the term "housing" may mean a structure that at least a portion of the first face 110A, the second face 110B, and the side face 110C of FIG. 1 or FIG. 2. According to an embodiment, at least a portion of the first face 110A may be formed by a substantially transparent front plate 102 (e.g., a glass plate or a polymer plate including various coating layers). The second face 110B may be formed by a substantially opaque rear plate 111. The rear plate 111 may be formed of, for example, coated or colored glass, ceramic, a polymer, or a metal (e.g., aluminum, stainless steel (STS), or magnesium), or a combination of two or more of these materials. The side face 110C may be formed by a side bezel structure 118 (or a "side member") coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

According to an embodiment, the electronic device 100 may include one or more of a display 101, audio modules 103, 107, and 114, sensor modules 104 and 119, camera modules 105, 112, and 113, key input devices 115, 116, and 117, an indicator 106, and connector holes 108 and 109. In some embodiments, in the electronic device 100, at least one of the components (e.g., a key input devices 115, 116, or 117 or the sensor module 106) may be omitted, or other components may be additionally included.

The display 101 may be exposed through, for example, a large portion of the front plate 102. The display 101 may be coupled to or disposed adjacent to a touch-sensing circuit, a pressure sensor capable of measuring touch intensity (pressure), and/or a digitizer configured to detect a magnetic-field-type stylus pen.

The audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker) 104.

The sensor modules 104 and 119 may generate electrical signals or data values corresponding to the internal operating state or the external environmental state of the electronic device 100. The sensor modules 104 and 119 may include, for example, a first sensor module 104 (e.g., a proximity sensor) and/or a second sensor module (not illustrated) (e.g., a fingerprint sensor) disposed on the first face 110A of the housing 110, and/or a third sensor module 119 (e.g., an HRM sensor) disposed on the second face 110B of the housing 110. The fingerprint sensor may be disposed not only on the first face 110A of the housing 110 (e.g., the home key button 115), but also on the second face 110B. The electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include a first camera device 105 disposed on the first face 110A of the electronic device 100 and a second camera device 112 disposed on the second face 110B thereof, and/or a flash 113. The camera modules 105 and 112 may include one or more lenses, an image sensor, and/or an image signal processor. The flash 113 may include, for example, a light-emitting diode or a xenon lamp. In some embodiments, two or more lenses (e.g., a wide-angle lens and a telephoto lens) and image sensors may be disposed on one face of the electronic device 100.

The key input devices 115, 116, and 117 may include a home key button 115 disposed on the first face 110A of the housing 110, a touch pad 116 disposed in the vicinity of the home key button 115, and/or a side key button 117 disposed on the side face 110c of the housing 110. In another embodiment, the electronic device 100 may not include some or all of the above-mentioned key input devices 115, 116, and 117, and the function of a non-included key input device 115, 116, or 117 may be implemented on the display 101 in another form such as a soft key.

The indicator 106 may be disposed on, for example, the first face 110A of the housing 110. The indicator 106 may include an LED as long as it can provide, for example, the state information of the electronic device 100 in an optical form.

The connector holes 108 and 109 may include a first connector hole 108 that is capable of accommodating a connector (e.g., a USB connector) for transmitting and receiving power and/or data to and from an external electronic device, and/or a second connector hole 109 that is capable of accommodating a connector (e.g., an earphone jack) for transmitting and receiving an audio signal to and from an external electronic device.

Figure 3:
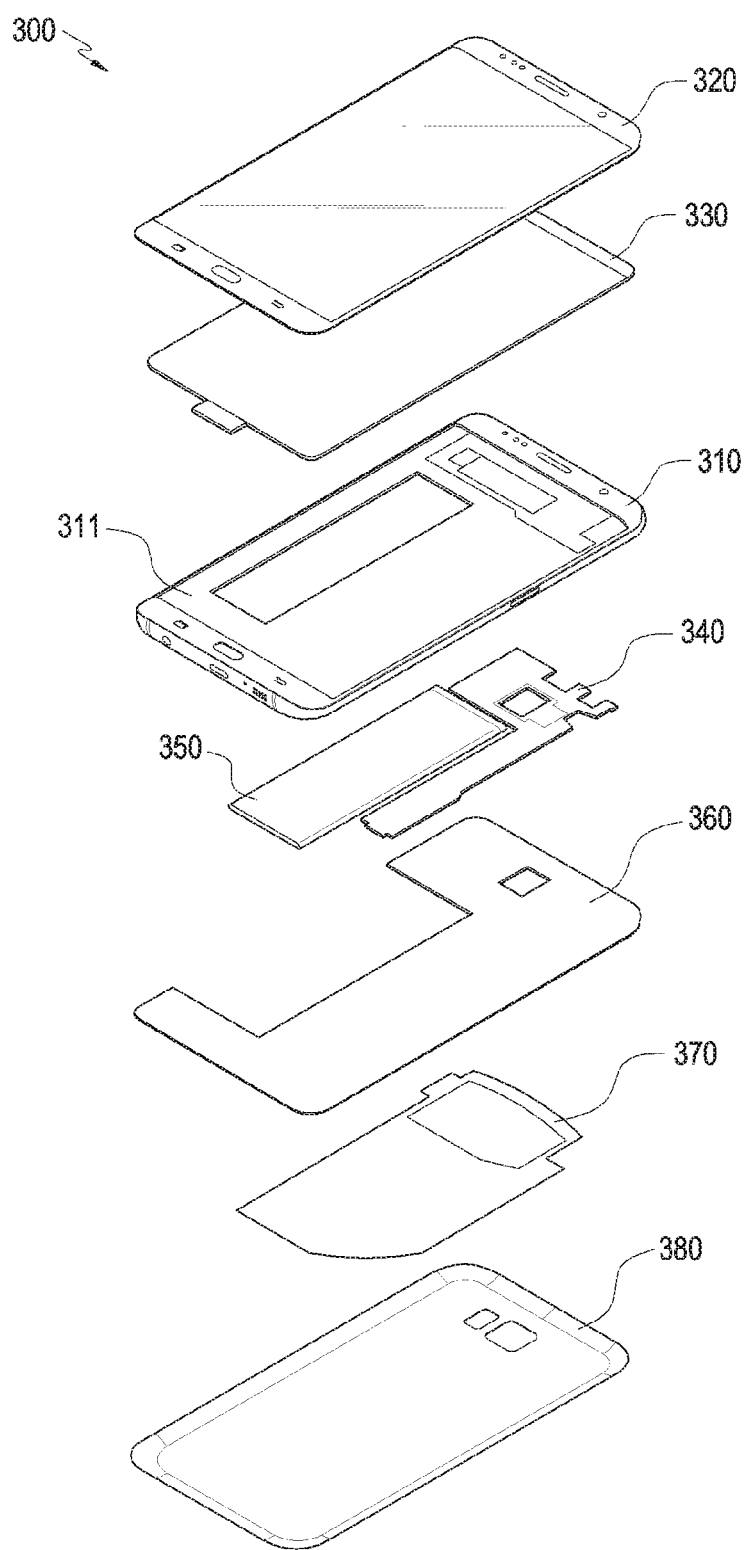
FIG. 3 is an exploded perspective view illustrating the electronic device of FIG. 1.

FIG. 3 is an exploded perspective view illustrating the electronic device of FIG. 1.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, in the electronic device 300, at least one of the components (e.g., the support member 311 or the second support member 360) may be omitted, or other components may be additionally included. At least one of the components of the electronic device 300 may be the same as or similar to at least one of the components of the electronic device 300 of FIG. 1 or 2, and a redundant description thereof is omitted below.

The first support member 311 may be disposed inside the electronic device 300, and may be connected to the side bezel structure 310 or may be integrally formed with the side bezel structure 310. The first support member 311 may be formed of, for example, a metal material and/or a non-metal material (e.g., a polymer). The display 330 may be coupled to one face of the first support member 311, and the printed circuit board 340 may be coupled to the other face of the first support member 311. On the printed circuit board 340, a processor, memory, and/or an interface may be mounted. The processor may include at least one of, for example, a central processing unit, an application processor, a graphics processor, an image signal processor, a sensor hub processor, or a communication processor.

The memory may include, for example, volatile memory or nonvolatile memory.

The interface may include, for example, a high-definition multimedia interface (HDMI), a universal serial bus (USB) interface, an SD card interface, and/or an audio interface. The interface may electrically or physically connect, for example, the electronic device 300, to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed on substantially the same plane as, for example, the printed circuit board 340. The battery 350 may be disposed in the state of being embedded in the electronic device 300, or may be detachably mounted on the electronic device 300.

The antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 is capable of, for example, performing short-range communication with an external device or transmitting and receiving power required for charging to and from an external device in a wireless manner. In another embodiment, an antenna structure may be formed by the side bezel structure 310 and/or a portion of the first support member 311, or a combination thereof.

Figure 4:
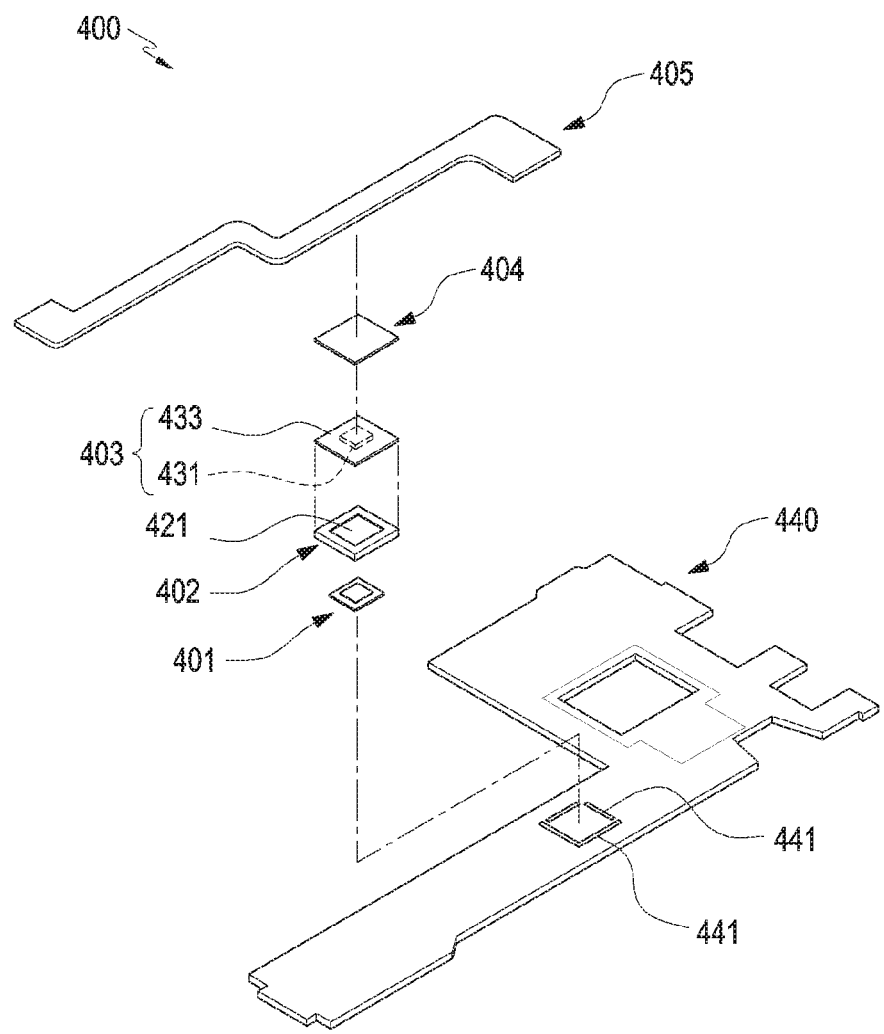
FIG. 4 is an exploded perspective view illustrating a heat radiation structure of an electronic device according to various embodiments of the disclosure.
Figure 5:
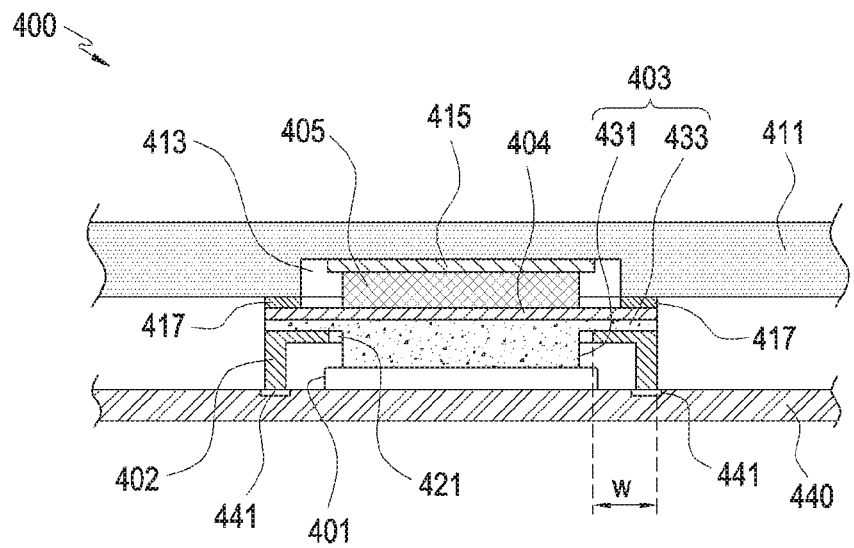
FIG. 5 is a cross-sectional view for describing the heat radiation structure of the electronic device according to various embodiments of the disclosure.

FIG. 4 is an exploded perspective illustrating a heat radiation structure 400 of an electronic device according to various embodiments of the disclosure. FIG. 5 is a cross-sectional view for describing the heat radiation structure 400 of the electronic device according to various embodiments of the disclosure.

Referring to FIGS. 4 and 5, the heat radiation structure 400 is to transfer and release heat generated from an electric component 401 (e.g., a processor mounted in the electronic device 100 of FIG. 1) disposed on one face of the circuit board 440, and may include a heat transfer member 403 and a heat conductive member 404, which are disposed to correspond to the electric component 401.

According to various embodiments, the circuit board 440 may include a main circuit board (e.g., the printed circuit board 340 in FIG. 3) or an auxiliary circuit board of an electronic device, and may include electrically conductive pad(s) 441 formed on one face thereof. The electrically conductive pad 441 may be formed at the periphery of a predetermined region, for example, at the periphery of the region in which an electric component 401 is mounted. According to an embodiment, the electrically conductive pad 441 may be formed in a single printed circuit pattern forming a closed curve, and in another embodiment, a plurality of electrically conductive pads 441 may be arranged along a closed curve trajectory. The closed curve or the closed curve trajectory formed by the electrically conductive pad(s) 441 may be located around the region in which the electric component 401 is mounted. In some embodiments, the electrically conductive pad 441 may be connected to a ground conductor (not illustrated) disposed or formed in the circuit board 440.

According to various embodiments, the electric component 401 may include an integrated circuit chip. For example, the electric component 401 may be a semiconductor including one or more of a central processing unit, an application processor, a graphic processor, an image signal processor, a sensor hub processor, and a communication processor. According to an embodiment, on one face of the circuit board 440, the electric component 401 may be mounted in a region surrounded by the electrically conductive pad 441 through a surface mounting process. Although not illustrated in detail, the electric component 401 may be mounted on the circuit board 440 via a ball grid array (BGA) structure or the like, and may be connected to the signal wires provided on the circuit board 440.

According to various embodiments, the heat transfer member 403 may have a high thermal conductivity, for example, by including carbon fiber. The carbon fiber may be easily processed to form a heat transfer path in a direction required by the heat radiation structure 400 or in accordance with the design of the heat radiation structure 400. In some embodiments, the heat transfer member 403 may have a property of accumulating elastic force while being compressed to some extent by an external force. For example, when assembled with the heat conductive member 404 or the support member 411, the heat transfer member 403 may be fixed in the state of being compressed between the circuit board and the heat conductive member 404 or the support member 411. In an embodiment, the heat transfer member 403 may have an electromagnetic shielding function by including magnetic particles or ferrite particles. In still another embodiment, in order to improve electromagnetic shielding performance, the surface of the heat transfer member 403 may be at least partially plated or coated with metal (e.g., nickel) particles having high electrical conductivity. In another embodiment, the heat transfer member 403 may include a film enclosing the surface thereof, and the film may be made of a metal having high electrical conductivity or plated or coated with the metal.

According to an embodiment, the heat transfer member 403 may include a body portion 431 having a size substantially corresponding to one face (e.g., the upper face) of the electric component 401, and a flange portion 433 extending around the body portion 431. For example, the body portion 431 may be attached to the upper face of the electric component 401, and may directly absorb or receive heat generated from the electric component 401. Heat absorbed by or transferred to the body portion 431 may be radiated and transferred to the outside or another structure through the flange portion 433.

According to various embodiments, the heat radiation structure 400 may further include an electromagnetic shielding member 402 disposed on one face of the circuit board 440. For example, the shielding member 402 may be disposed to at least partially surround a region or a space in which the electric component 401 is mounted. Alternatively, the shielding member 402 may be disposed to at least partially enclose the electric component 401. According to an embodiment, the shielding member 402 may be made of an electrically conductive material, and may be mounted on the electrically conductive pad 441 through a surface mount process or may be electrically connected to the electrically conductive pad 441. For example, the shielding member 402 may be electrically connected to a ground conductor embedded in the circuit board 440. According to an embodiment, the heat radiation structure 400 may include an opening 421 formed in the shielding member 401. When the shielding member 402 is mounted on the circuit board 401, the opening 421 may be located to correspond to the electric component 401. For example, at least a portion (e.g., the upper face) of the electric component 401 may be exposed to the outside of the shielding member 402 through the opening 421.

According to various embodiments, the shielding member 402 may provide a means for mounting and fixing the heat transfer member 403 to the circuit board 440. For example, a portion of the heat transfer member 403 may be disposed to cover at least a portion of the opening 421. In an embodiment, the body portion 431 may be at least partially positioned in the opening 421 and may be attached to the upper face of the electric component 401, and the flange portion 433 may be at least partially attached to the outer face (e.g., the upper face) of the shielding member 402 around the opening 421.

According to various embodiments, the heat transfer member 403 may substantially close the opening 421. For example, the circuit board 440, the shielding member 402, and the heat transfer member 403 may seal the space (or region) in which the electric component 401 is disposed from the external environment. In an embodiment, the heat transfer member 403 may provide an electromagnetic shielding function with the shielding member 402 by including magnetic particles (or ferrite particles). In another embodiment, the heat transfer member 403 may absorb or receive heat directly from the electric component 401, may radiate or release the heat to another structure (e.g., the heat conductive member 404 or the support member 411) or an external space (e.g., the space outside the shielding member 402). For example, the heat transfer member 403 may provide an electromagnetic shielding structure for the electric component 401 together with the shielding member 402, and may smoothly release the heat generated by the electric component 401.

In an embodiment, the flange portion 433 may be attached to the upper face of the shielding member 402 substantially throughout the circumference of the opening 421. For example, the flange portion 433 may disposed to completely cover the opening 421. The flange portion 433 may be bonded to the shielding member 403 by a width w of at least 1 mm, thereby forming a sufficient electromagnetic shielding structure while having a more stable fixing structure.

According to various embodiments, the heat radiation structure 400 may further include a heat conductive member 404 or a heat radiation member 405, thereby facilitating heat transfer and radiation. The heat conductive member 404 may include, for example, a sheet or a plate made of a metal material such as copper (Cu), and the heat transfer member 403 may be attached to, for example the outer face (e.g., the upper face) of the flange portion 433. In bonding different structures, for example, the flange portion 433 and the heat conductive member 404, a larger bonding area may increase heat transfer efficiency. For example, the heat conductive member 404 may be provided in a sufficient size at least corresponding to the flange portion 433.

According to various embodiments, the heat radiation member 405 may absorb heat from a portion exposed to a relatively high temperature environment, and may transfer and release the heat to a portion located in a low temperature region. The heat radiation member 405 may have, for example, a heat pipe structure in which a heat transfer medium (e.g., liquid or steam) is accommodated. In an embodiment, a portion of the heat radiation member 405 may be disposed to correspond to the heat transfer member 403 and/or the heat conductive member 404, and may be in direct contact with the heat conductive member 404 so as to receive heat. For example, the heat absorbed by the heat transfer member 403 from the electric component 401 may be transferred to the heat conductive member 404, the heat radiation member 405, and the like, and the heat radiation member 405 may radiate and release the heat. As described above, the heat radiation structure 400 may absorb and radiate the heat generated by the electric component 401, thereby lowering the temperature of the electric component 401 or the temperature of the space in which the electric component 401 is disposed.

According to various embodiments, the heat radiation member 405 may include a support member 411 (e.g., the first support member 311 in FIG. 3) of the electronic device. In order to mount and accommodate the heat radiation member 405, an accommodation groove 413 may be formed in one face of the support member 411, for example, the face facing the circuit board 440. The accommodation groove 413 may have a depth substantially corresponding to the thickness of the heat radiation member 405, and the heat radiation member 405 may be accommodated in the accommodation groove 413, thereby suppressing an increase in thickness of the heat radiation structure 400 or the electronic device (e.g., the electronic devices 100 and 300 in FIGS. 1 to 3). According to an embodiment, the support member 411 may be at least partially made of a heat conductive material. For example, the heat absorbed by the heat radiation member 405 may be transferred and radiated to the support member 411. In another embodiment, the heat radiation member 405 may be mounted in the accommodation groove 413 using a heat conductive tape 415. For example, the heat transfer member 415 may transfer the heat from the heat radiation member 405 to the support member 411.

According to various embodiments, when the support member 411 is disposed, the heat radiation structure 400 may further include an adhesive member 417 (e.g., double-sided tape), which attaches or fixes the heat conductive member 404 to the support member 411. According to an embodiment, when the support member 411 is made of an electrically conductive material, the adhesive member 417 may be made of electrically insulating double-sided tape. As described above, the first support member 311 of FIG. 3 may be connected to or integrally formed with the side bezel structure 310, and may be made of a metal material, for example, an electrically conductive material. The support member 411 may be part or the entirety of the first support member 311, and may be connected to or integrally formed with the side bezel structure 310. Since the side bezel structure 310 is exposed to the external environment, an electric shock (e.g., static electricity) generated in the external environment may be transmitted to the inside of the electronic device (e.g., the electronic device 300 in FIG. 3). In various embodiments of the disclosure, when the adhesive member 417 is made of electrically insulating double-sided tape, it is possible to prevent the electric shock from being transferred to the circuit board 440 or the electric component 401.

As described above, the heat radiation structure according to various embodiments of the disclosure or the electronic device including the same is capable of preventing deterioration of heat radiation performance due to the electromagnetic shielding structure (e.g., the shielding member 402 in FIG. 5) by including the heat transfer member (e.g., the heat transfer member 403 in FIG. 5) connected to the electric component. Although the shielding structure may be partially opened in order to dispose the heat transfer member therein, the heat transfer member of the heat radiation structure according to various embodiments of the disclosure may include magnetic particles or ferrite particles, thereby preventing deterioration of electromagnetic shielding performance. According to various embodiments, the heat radiation structure (e.g., the heat radiation structure 400 in FIG. 5) may include a heat conductive member and a heat radiation member, and the like connected to the heat transfer member, thereby facilitating the transfer and radiation of heat generated from the electric component.

The electromagnetic shielding performance of a heat radiation structure in an electronic device according to various embodiments of the disclosure will be described with reference to FIG. 6.

Figure 6:
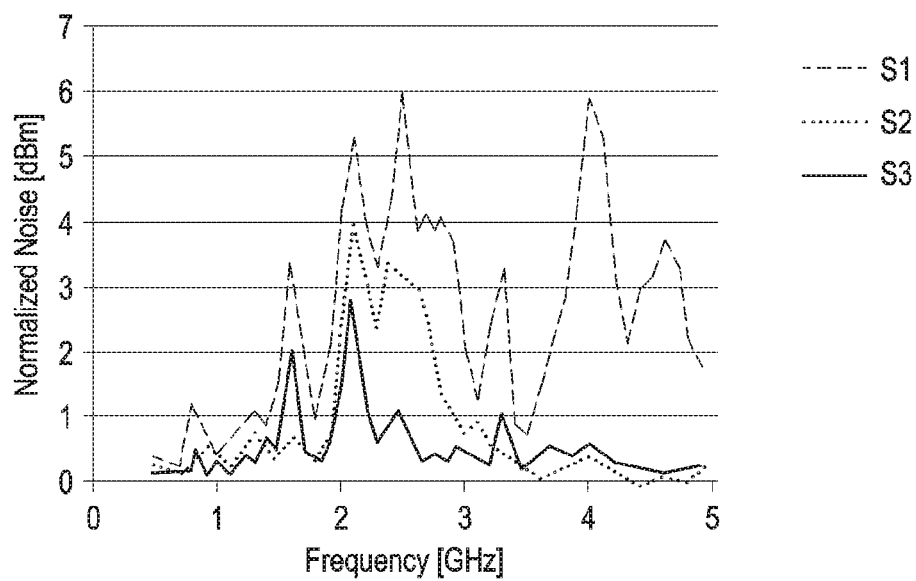
FIG. 6 is a graph representing shielding performance measured from structures in an electronic device according to various embodiments of the disclosure.

FIG. 6 is a graph representing shielding performance measured from structures in which a heat radiation structure together with the shielding member 402 illustrated in FIG. 4 or FIG. 5, in which the graph indicated by "S1" shows the shielding performance of a heat radiation structure in which a heat transfer member in which shielding performance is not considered (e.g., only heat radiation performance is considered) is disposed, the graph indicated by "S2" shows the shielding performance of a heat radiation structure in which an additional shielding member (e.g., an electromagnetic shielding sheet or an electrically conductive film enclosing a heat transfer member) is disposed together with the heat transfer member, and the graph indicated by "S3" shows the shielding performance of the heat radiation structure according to various embodiments of the disclosure.

Comparing the graphs indicated by S1 and S3, it can be seen that the electromagnetic shielding performance of the heat radiation structure according to various embodiments of the disclosure is significantly improved throughout the operation clock of the electric component. Comparing the graphs indicated by S2 and S3, it can be seen that the electromagnetic shielding performance of the heat radiation structure according to various embodiments of the disclosure is improved in the operating clock of at least in the range of 2 GHz to 3 GHz. In view of the results of the above measurement, it can be expected that in the heat radiation structure in which the shielding performance is not considered, the operating environment of the electric component will be poor due to electromagnetic generated from the surroundings. Accordingly, in configuring the heat radiation structure, it is necessary to consider the electromagnetic shielding performance, and through the heat radiation structure in which an additional shielding member is disposed, or the heat radiation structure according to various embodiments of the disclosure, it is possible to secure a certain degree of shielding performance.

Meanwhile, the results of measuring the heat radiation performance of each of the heat radiation structure in which an additional shielding structure is arranged and the heat radiation structure according to various embodiments of the disclosure are shown in the following Table 1. Hereinafter, the heat radiation structure in which the additional shielding structure is disposed will be referred to as "heat radiation structure S2", and the heat radiation structure according to various embodiments of the disclosure will be referred to as "heat radiation structure S3".

TABLE 1

| Items | Heat radiation Structure S2 | Heat radiation Structure S3 |
|---|---|---|
| Thermal Conductivity (heat transfer member) | 28 W/mK | 15 W/mK |
| Heat Resistance (heat radiation structure as a whole) | 3.93 K/W | 0.85 K/W |
| Temperature Difference (electronic device) | 11.8 degrees C. | 2.6 degrees C. |

As shown in Table 1, it can be seen that although the heat transfer member having a higher thermal conductivity was used in the heat radiation structure S2, the heat resistance of the entire heat radiation structure thereof is higher than that of the heat radiation structure S3. That is, it can be seen that the heat radiation structure S3 has higher performance than the heat radiation structure S2 in terms of heat transfer and radiation rate (or efficiency). This is expected because heat transfer between the additionally disposed shielding member(s) and the heat transfer member is not smooth. This difference in heat radiation performance is also shown through the results of measuring a temperature difference. Here, the term "temperature difference" may mean a difference between the temperature at a position of a heat-generating electric component (a position where the heat radiation structure absorbs heat) and the lowest temperature among temperatures measured in the entire electronic device. As more heat is concentrated in a specific portion in the electronic device, the temperature difference becomes larger, and when heat transfer and radiation are smooth, the temperature difference becomes smaller.

As described in Table 1, the heat radiation structure according to various embodiments of the disclosure may have a low heat resistance characteristic even in heat radiation performance while providing a stable shielding structure as the heat transfer member itself. Since the heat radiation structure has a low heat resistance characteristic, it is possible to quickly transfer and radiate heat generated from an electric component or the like so as to improve temperature variation in the entire electronic device. For example, it can be seen that compared to the heat radiation structure in which the additional shielding member is disposed, the temperature difference is improved by 9 degrees C. or more in the heat radiation structure according to various embodiments of the disclosure. As described above, the heat radiation structure according to various embodiments of the disclosure is capable of preventing deterioration of the operating performance of an electric component by having improved heat radiation performance while providing a stable shielding structure.

As described above, according to various embodiments of the disclosure, an electronic device may include:

a circuit board; an electric component disposed on one face of the circuit board;

a heat conductive member disposed corresponding to an upper face of the electric component; and a heat transfer member disposed between the electric component and the heat conductive member and including carbon fiber.

According to various embodiments, the electronic device may further include:

an electromagnetic shielding member disposed on one face of the circuit board; and an opening formed in the shielding member. The opening may be located to face an upper face of the electric component.

According to various embodiments, a portion of the heat transfer member may be disposed to cover at least a portion of the opening.

According to various embodiments, the heat transfer member may include:

a body portion at least partially located within the opening and attached to the upper face of the electric component; and a flange portion extending around the body portion. At least a portion of the flange portion may be attached to an outer face of the shielding member around the opening.

According to various embodiments, the heat transfer member may include magnetic particles.

According to various embodiments of the disclosure, an electronic device may include:

a circuit board; an electric component disposed on one face of the circuit board; an electromagnetic shielding member mounted so as to cover at least a portion of the electric component on the one face of the circuit board; an opening formed in the shielding member so as to expose a portion of the electric component to the outside of the shielding member; and a heat transfer member attached to an outer face of the shielding member to close the opening and connected to the portion of the electric component through the opening.

The heat transfer member may form an electromagnetic shielding structure together with the shielding member.

According to various embodiments, the heat transfer member may include carbon fiber and magnetic particles.

According to various embodiments, the electronic device may further include a heat radiation member configured to absorb, heat from the heat transfer member and to radiate and release the heat.

According to various embodiments, the electronic may further include a heat conductive member disposed between the heat transfer member and the heat radiation member.

According to various embodiments, the heat conductive member may include a metal sheet or a metal plate.

According to various embodiments, the heat transfer member may include:

a body portion at least partially located within the opening and attached to the upper face of the electric component; and a flange portion extending around the body portion.

The flange portion may be attached to an outer face of the shielding member around the opening.

According to various embodiments, the electronic device may further include a support member disposed to face at least a portion of one face of the circuit board.

According to various embodiments, the heat transfer member may be fixed in a compressed state between the electric component and the support member.

According to various embodiments, the electronic device may further include a heat conductive member attached to one face of the support member. A portion of the heat transfer member may be attached to the upper face of the electric component, and another portion of the heat transfer member may be attached to the heat conductive member.

According to various embodiments, the electronic device may further include:

an accommodation groove formed in the support member; and a heat radiation member disposed in the accommodation groove.

The heat radiation member may absorb heat from the heat transfer member, and may radiate and release the heat.

According to various embodiments, the heat radiation member may be attached to the support member in the accommodation groove so as to transfer and radiate heat to the support member.

According to various embodiments, the electronic device may further include a heat conductive member attached to the support member, and the heat conductive member may be bonded to the heat radiation member while closing the accommodation groove.

According to various embodiments, a portion of the heat transfer member may be attached to the upper face of the electric component, and another portion of the heat transfer member may be attached to the heat conductive member.

According to various embodiments, the electronic device may further include electrically insulating double-sided tape that attaches the heat conductive member to the support member.

According to various embodiments, the electronic device may further include an electrically conductive pad disposed on one face of the circuit board, and the shield member may be bonded to the electrically conductive pad so as to be electrically connected to the circuit board.

In the foregoing detailed description of the disclosure, specific embodiments of the disclosure have been described. However, it will be evident to a person ordinarily skilled in the art that various modifications can be made without departing from the scope of the disclosure.

The invention claimed is:

1. An electronic device comprising:
a circuit board;
an electric component disposed on one face of the circuit board;
an electromagnetic shielding member mounted so as to cover at least a portion of the electric component on the one face of the circuit board;
an opening formed in the shielding member so as to expose a portion of the electric component to an outside of the shielding member;
a heat transfer member including at least a portion of a flange portion and attached to an outer face of the shielding member to close the opening and connected to the portion of the electric component; and
a support member disposed to face at least a portion of the circuit board,
wherein the heat transfer member forms an electromagnetic shielding structure together with the shielding member and is fixed in a compressed state between the electric component and the support member,
wherein the electronic device further comprises:
an accommodation groove formed in the support member;
a heat radiation member disposed in the accommodation groove;
a heat conductive member at least partially disposed between the heat transfer member and the heat radiation member; and
electrically insulating double-sided tape configured to attach the heat conductive member to the support member, and
wherein the heat radiation member absorbs heat from the heat transfer member, and radiates and releases the heat.

2. The electronic device of claim 1, wherein a portion of the heat transfer member is attached to the upper face of the electric component, and another portion of the heat transfer member is attached to the heat conductive member.

3. The electronic device of claim 1, wherein the heat conductive member is bonded to the heat radiation member while closing the accommodation groove.

4. The electronic device of claim 3, wherein a portion of the heat transfer member is attached to the upper face of the electric component, and another portion of the heat transfer member is attached to the heat conductive member.

5. The electronic device of claim 1, further comprising:
an electrically conductive pad disposed on one face of the circuit board,
wherein the shield member is bonded to the electrically conductive pad so as to be electrically connected to the circuit board.

* * * * *